United States Patent
Xu

(10) Patent No.: US 11,848,322 B2
(45) Date of Patent: Dec. 19, 2023

(54) ELECTRO-STATIC DISCHARGE PROTECTION CIRCUIT AND SEMICONDUCTOR DEVICE

(71) Applicant: CHANGXIN MEMORY TECHNOLOGIES, INC., Hefei (CN)

(72) Inventor: Qian Xu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/657,741

(22) Filed: Apr. 1, 2022

(65) Prior Publication Data
US 2023/0012301 A1    Jan. 12, 2023

Related U.S. Application Data

(63) Continuation of application No. PCT/CN2021/122576, filed on Oct. 8, 2021.

(30) Foreign Application Priority Data

Jul. 12, 2021 (CN) .......................... 202110783138.3

(51) Int. Cl.
 *H01L 27/02* (2006.01)
 *H02H 9/04* (2006.01)
 *H02H 3/00* (2006.01)

(52) U.S. Cl.
 CPC ......... *H01L 27/0262* (2013.01); *H02H 9/046* (2013.01); *H02H 3/006* (2013.01)

(58) Field of Classification Search
 CPC ..... H01L 27/0262; H02H 9/046; H02H 3/006

USPC .......................................................... 361/56
See application file for complete search history.

(56) References Cited

U.S. PATENT DOCUMENTS

| | | | |
|---|---|---|---|
| 5,400,202 A | 3/1995 | Metz | |
| 6,236,087 B1 | 5/2001 | Daly | |
| 7,800,128 B2 | 9/2010 | Domanski | |
| 8,178,897 B2 | 5/2012 | Domanski | |
| 8,320,091 B2* | 11/2012 | Salcedo | H02H 9/046 361/111 |
| 8,471,292 B2 | 6/2013 | Domanski | |
| 8,759,871 B2* | 6/2014 | Song | H01L 27/0262 257/355 |
| 8,922,960 B2 | 12/2014 | Van Wijmeersch | |
| 8,956,924 B2 | 2/2015 | Domanski | |

(Continued)

FOREIGN PATENT DOCUMENTS

| | | | | |
|---|---|---|---|---|
| CN | 205564738 U | | 9/2016 | |
| CN | 111129006 A | * | 5/2020 | ......... H01L 27/0262 |

(Continued)

*Primary Examiner* — Dharti H Patel
(74) *Attorney, Agent, or Firm* — SYNCODA LLC; Feng Ma

(57) ABSTRACT

An Electrostatic Discharge (ESD) protection circuit includes a first discharge path and a second discharge path. The first discharge path is located between a first potential terminal and a second potential terminal. The second discharge path is located between the first potential terminal and the second potential terminal, and is connected to the first discharge path in parallel. The first discharge path and the second discharge path are used for discharging electrostatic charges. At least one of the first discharge path and the second discharge path includes a Silicon Controlled Rectifier (SCR).

18 Claims, 10 Drawing Sheets

(56) References Cited

U.S. PATENT DOCUMENTS

| | | |
|---|---|---|
| 9,263,430 B2 | 2/2016 | Domanski |
| 9,843,183 B2 * | 12/2017 | Lv .................... H02H 9/046 |
| 9,935,096 B2 | 4/2018 | Ikeda |
| 10,020,299 B2 * | 7/2018 | Lai ................ H01L 27/0262 |
| 10,177,566 B2 * | 1/2019 | Zhao .............. H01L 27/0262 |
| 10,608,429 B2 * | 3/2020 | Tsaur .................. H02H 9/04 |
| 2005/0275984 A1 * | 12/2005 | Liu ................ H01L 27/0262 361/56 |
| 2009/0166671 A1 * | 7/2009 | Hwang ........... H01L 27/0262 257/137 |
| 2009/0195951 A1 | 8/2009 | Sorgeloos |
| 2009/0309129 A1 | 12/2009 | Domanski |
| 2010/0321843 A1 | 12/2010 | Domanski |
| 2012/0218671 A1 | 8/2012 | Domanski |
| 2013/0277712 A1 | 10/2013 | Domanski et al. |
| 2014/0063663 A1 * | 3/2014 | Altolaguirre ........ H02H 9/046 361/56 |
| 2014/0126089 A1 * | 5/2014 | Chang ................ H02H 9/046 361/56 |
| 2015/0144996 A1 | 5/2015 | Domanski et al. |
| 2017/0179106 A1 * | 6/2017 | Ikeda ............... H01L 27/0251 |
| 2017/0244244 A1 * | 8/2017 | Ikeda ................. H01L 29/744 |
| 2017/0278839 A1 * | 9/2017 | Lai ................ H01L 27/0262 |
| 2017/0324239 A1 * | 11/2017 | Tsaur ............... H01L 27/0285 |
| 2018/0248366 A1 * | 8/2018 | Wu ..................... H02H 1/0007 |
| 2021/0036512 A1 * | 2/2021 | Ikeda ................. H02H 9/046 |

FOREIGN PATENT DOCUMENTS

| | | | | |
|---|---|---|---|---|
| WO | WO-2021213024 A1 * | 10/2021 | ......... | H01L 27/0262 |
| WO | WO-2022142216 A1 * | 7/2022 | ............. | H02H 9/046 |
| WO | WO-2023279654 A1 * | 1/2023 | ......... | H01L 27/0262 |

* cited by examiner

ELECTRO-STATIC DISCHARGE PROTECTION CIRCUIT AND SEMICONDUCTOR DEVICE

CROSS-REFERENCE TO RELATED APPLICATIONS

This is a continuation of International Application No. PCT/CN2021/122576 filed on Oct. 8, 2021, which claims priority to Chinese Patent Application No. 202110783138.3 filed on Jul. 12, 2021. The disclosures of the above-referenced applications are hereby incorporated by reference in their entirety.

BACKGROUND

Static electricity is one of the inevitable phenomena for semiconductor devices. To reduce the impact of static electricity on devices, it is necessary to design effective Electro-Static discharge (ESD) protection circuits in the process of manufacturing semiconductor devices. With the continuous development of large-scale integrated circuits, the need for high levels of integration keeps increasing. As the devices become more and more precise, a huge challenge for the design of ESD protection circuits is brought.

SUMMARY

Embodiments of the present disclosure relate to semiconductor manufacturing technologies, and relate to, but not limited to, an Electro-Static discharge (ESD) protection circuit and a semiconductor device.

In view of this, to resolve at least one problem in some implementations, embodiments of the present disclosure provide an Electro-Static discharge (ESD) protection circuit. The ESD protection circuit includes a first discharge path and a second discharge path.

The first discharge path is located between a first potential terminal and a second potential terminal.

The second discharge path is located between the first potential terminal and the second potential terminal, and is connected to the first discharge path in parallel. The first discharge path and the second discharge path are used for discharging electrostatic charges.

At least one of the first discharge path and the second discharge path includes a Silicon Controlled Rectifier (SCR).

DETAILED DESCRIPTION

In the manufacturing of semiconductor integrated circuits, ESD protection circuits are often used to provide ESD protection for pads and other locations that are prone to static electricity. These protection circuits enable quick discharge of electrostatic charges when ESD is encountered at pad locations, thereby protecting integrated circuit products and reducing electrostatic damage. Embodiments of the present disclosure provide an ESD protection circuit, which can be applied to a precise integrated circuit structure, to facilitate quickly discharge of electrostatic charges, thereby protecting integrated circuit products and extending the service life of the products.

The technical solutions of the present disclosure are further described below in detail with reference to the accompanying drawings and the embodiments.

Figure 1:
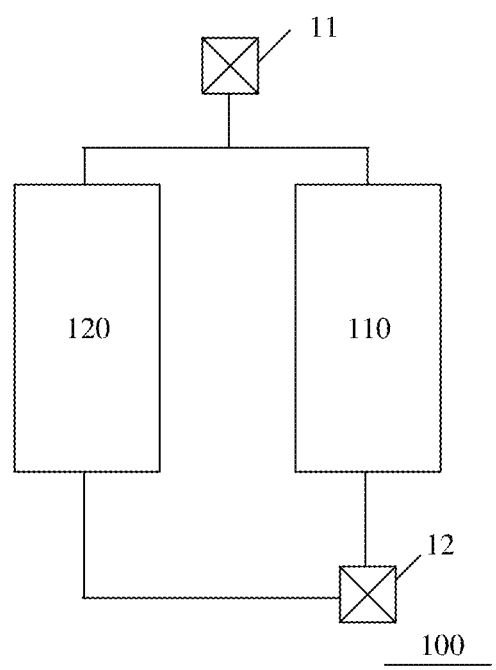
FIG. 1 is the first schematic structural diagram of an ESD protection circuit according to the embodiments of the present disclosure.

Embodiments of the present disclosure provide an ESD protection circuit. As shown in FIG. 1, the ESD protection circuit 100 includes a first discharge path 110 and a second discharge path 120.

The first discharge path 110 is located between a first potential terminal 11 and a second potential terminal 12.

The second discharge path 120 is located between the first potential terminal 11 and the second potential terminal 12, and is connected to the first discharge path 110 in parallel. The first discharge path 110 and the second discharge path 120 are used for discharging electrostatic charges.

At least one of the first discharge path 110 and the second discharge path 120 includes an SCR.

The first potential terminal and the second potential terminal may be pad locations that are prone to ESD or terminals connected to pads, or may be connected to an external circuit, connected to a fixed voltage terminal or grounded. For example, the first potential terminal may be an anode of a circuit, and is connected to a positive potential. The second potential terminal may be a cathode of a circuit, and is connected to a negative potential or grounded.

In this embodiment of the present disclosure, the first discharge path and the second discharge path connected in parallel are used to discharge static electricity together. When static electricity occurs, electrostatic charges may be quickly discharged through both the first discharge path and the second discharge path, thereby reducing damage by electrostatic charges to the circuit.

Herein, the SCR may be used in at least one of the first discharge path and the second discharge path. For example, the first discharge path may include the SCR. The second discharge path uses another component, for example, an RC control circuit or other transistor component. The SCR may be composed of a discharge device that is composed of bipolar transistor devices and a trigger device that is used for triggering the discharge device to be conductive. The SCR may be formed in an area in which a substrate diffusion region and a well of a semiconductor product are located. An NPN structure or a PNP structure formed among different substrate diffusion regions and wells may form the bipolar transistor.

The application of the SCR to at least one discharge path facilitates the integration of a circuit in a semiconductor product, and is applicable to large-scale integrated circuits with high levels of integration. However, the SCR tends to latch up. When the SCR is triggered by static electricity to be conductive, a low resistance state is formed between the first potential terminal and the second potential terminal, to generate continuous electric leakage, resulting in a burnout of a device.

Therefore, in the embodiments of the present disclosure, two discharge paths are connected in parallel, so that a trigger voltage is low, a maintaining voltage is high, and latch-ups are reduced.

In some embodiments, the ESD protection circuit further includes an auxiliary subcircuit.

The auxiliary subcircuit is separately connected to the first discharge path and the second discharge path. The auxiliary subcircuit is configured to trigger the first discharge path and/or the second discharge path to be conductive.

In the embodiments of the present disclosure, the auxiliary subcircuit is used to trigger the first discharge path and/or the second discharge path to be conductive. If the first discharge path includes the SCR, the auxiliary subcircuit may be used as a trigger device of the first discharge path, and at the same time may be used to control the second discharge path. If both the first discharge path and the first discharge path include the SCR, the auxiliary subcircuit may be simultaneously used as a trigger device of the first discharge path and the second discharge path.

Figure 2:
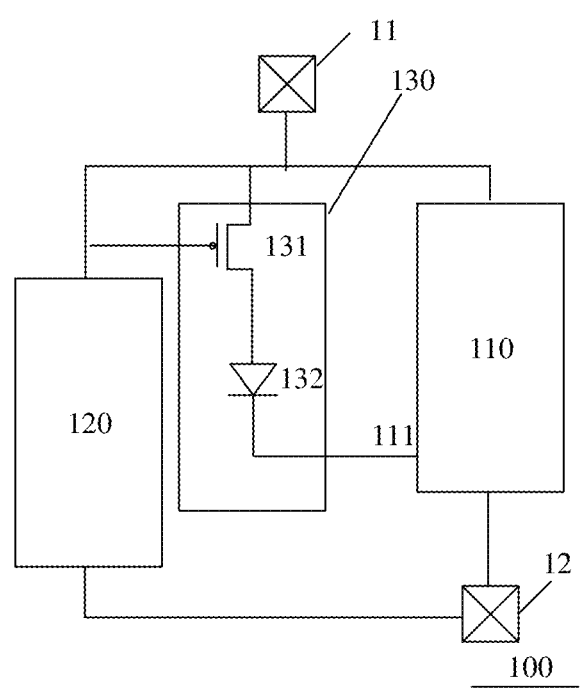
FIG. 2 is the second schematic structural diagram of an ESD protection circuit according to the embodiments of the present disclosure.

In some embodiments, as shown in FIG. 2, the first discharge path 110 includes the SCR, and the auxiliary subcircuit 130 includes a PMOS 131 and at least one diode 132.

The diode 132 is connected to the PMOS 131 in series, is connected to a control terminal 111 of the SCR, and is configured to trigger the first discharge path 110 to be conductive.

In this embodiment of the present disclosure, the first discharge path may include the SCR, and the auxiliary subcircuit is used as a control device of the first discharge path. The auxiliary subcircuit may include a PMOS and a diode connected in series. The PMOS is conductive or blocked, to trigger the first discharge path. The diode may be used to control a trigger voltage.

In some embodiments, the at least one diode includes at least two diodes, and the at least two diodes are connected in series and is connected to the PMOS in series.

In this embodiment of the present disclosure, the auxiliary subcircuit may include a plurality of diodes configured to control the trigger voltage. Therefore, a quantity of diodes may be used to control the trigger voltage for the first discharge path. For example, if a relatively low trigger voltage is required, a relatively small quantity of diodes is used. If a relatively high trigger voltage is required, a relatively large quantity of diodes is used.

In some embodiments, the PMOS is a common component of the auxiliary subcircuit and the second discharge path.

The auxiliary subcircuit may include a common component for the first discharge path or the second discharge path.

That is, the common component in the auxiliary subcircuit also belongs to the component passed or used by the discharge path of the first discharge path or the second discharge path.

In this embodiment of the present disclosure, the PMOS in above auxiliary subcircuit may be used as a common component of the auxiliary subcircuit and the second discharge path. That is, the second discharge path includes above PMOS. Meanwhile, the PMOS is conductive or blocked to control the first discharge path to be conductive or blocked.

In this embodiment of the present disclosure, the common component in the auxiliary subcircuit is used as a part of the second discharge path and is used to trigger the first discharge path, so that an overall quantity of components of the ESD protection circuit can be reduced, thereby reducing a space to be occupied and reducing costs.

In some embodiments, the first discharge path may include the SCR.

The second discharge path includes at least one transistor and an RC control circuit. The at least one transistor is conductive or blocked under the control of the RC control circuit. When the at least one transistor is conductive, the second discharge path is conductive.

In this embodiment of the present disclosure, the ESD protection circuit may be composed of the first discharge path that includes the SCR and the second discharge path that includes the transistor and the RC control circuit in parallel. In the second discharge path, the RC control circuit controls the transistor to be conductive or blocked, to control the second discharge path to be conductive or blocked.

The RC control circuit can reduce latch-ups caused by electric leakage in an ESD path, thereby improving product performance and extending the service life.

In some embodiments, the second discharge path at least includes one PMOS, and the PMOS is connected in a position in the RC control circuit.

In this embodiment of the present disclosure, when electrostatic charges need to be discharged, the second discharge path may conductive the PMOSFET to discharge electricity. The RC control circuit may control the PMOSFET to be conductive or blocked. Herein, "a position in the RC control circuit" refers to a position between a resistor and a capacitor in the RC control circuit.

When the first potential terminal generates static electricity, the first potential terminal is at a high potential instantly. Correspondingly, the position in the RC control circuit is at a low potential compared with the first potential terminal. In this case, the PMOS is conductive, so that charges can be discharged.

It needs to be noted that the PMOS herein may be a common component that is configured to trigger the first discharge path in above auxiliary subcircuit and also belongs to the second discharge path. Therefore, when the PMOS is conductive, the first discharge path may be triggered at the same time to discharge electricity.

Figure 3:
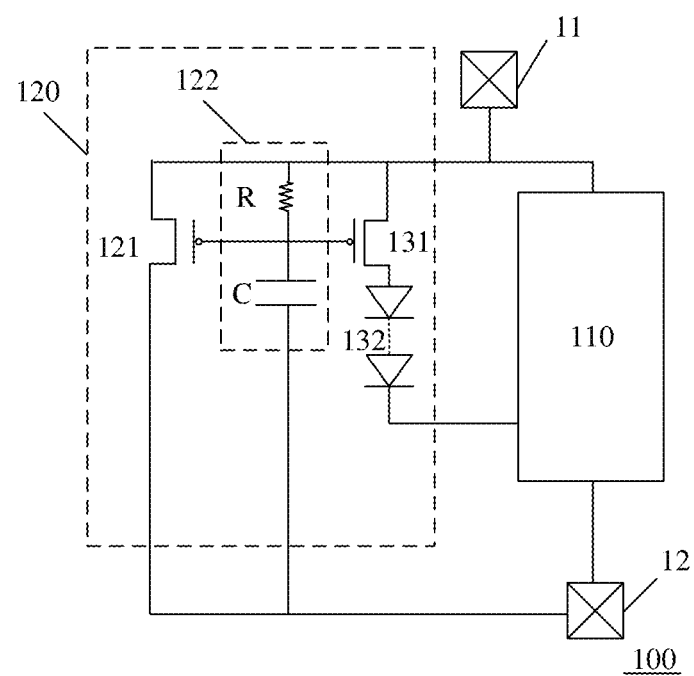
FIG. 3 is the third schematic structural diagram of an ESD protection circuit according to the embodiments of the present disclosure.

In some embodiments, as shown in FIG. 3, the second discharge path 120 includes two PMOSs, and the two PMOSs (including a first PMOS 121 and a second PMOS 131) are connected in the RC control circuit 122. The second PMOS 131 herein is the PMOS 131 in the foregoing embodiments.

In this embodiment of the present disclosure, in the second discharge path, two PMOSs may be connected in the position in the RC control circuit. One of the PMOSs is a common component that belongs to the auxiliary subcircuit and may be connected in series to the diode of the auxiliary subcircuit, and the other PMOS is connected between the first potential terminal and the second potential terminal and is used for discharging electrostatic charges.

In this way, an ESD capability can be improved, and a probability of a latch-up in the first discharge path can be reduced.

In some embodiments, a source and a drain of the first PMOS 121 of the two PMOSs are respectively connected to the first potential terminal and the second potential terminal.

Herein, the source and the drain of above PMOS are respectively connected to the first potential terminal and the second potential terminal to form a charge discharge path. When the circuit operates normally, the PMOSs are both in a blocked state. When electrostatic charges are generated at the first potential terminal, the two PMOSs are conductive and are used for discharging electrostatic charges and triggering the SCR to discharge electrostatic charges.

Figure 4:
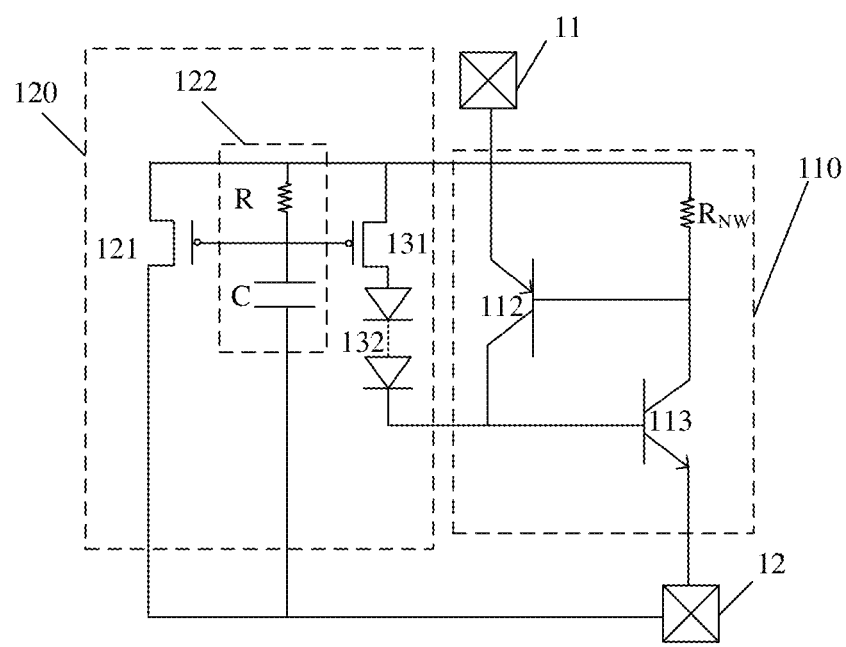
FIG. 4 is the fourth schematic structural diagram of an ESD protection circuit according to the embodiments of the present disclosure.

In some embodiments, as shown in FIG. 4, the SCR includes a first switch 112 and a second switch 113.

The first switch 112 is connected between the first potential terminal 11 and a control terminal of the second switch 113.

A control terminal of the first switch 112 is connected to the first potential terminal 11.

The second switch 113 is connected between the first potential terminal 11 and the second potential terminal 12.

In this embodiment of the present disclosure, the SCR is formed by two switches. Both the first switch and the second switch are three-terminal devices with a control terminal. The control terminal of the second switch is connected to the first switch. Therefore, after the first switch is conductive, a potential of the first potential terminal may be conducted to the control terminal of the second switch, to control the second switch to be conductive.

In some embodiments, the first switch is a PNP triode, and the second switch is an NPN triode.

Herein, the first switch is a PNP triode, which is composed of two P-type semiconductors with one N-type semiconductor sandwiched between them. Two ends of the P triode are respectively an emitter and a collector, and a control terminal is also referred to as a base.

When the PNP triode is conductive, a current flows into the triode through the emitter and flows out from the collector.

The second switch is an NPN triode, which is composed of two N-type semiconductors with one P-type semiconductor sandwiched between them. Two ends of the NPN triode are respectively an emitter and a collector, and a control terminal is also referred to as a base.

When the N triode is conductive, a current flows into the triode through the collector and flows out from the emitter.

In some embodiments, the SCR further includes a first resistor.

The control terminal of the first switch is connected to the first potential terminal through the first resistor.

The second switch is connected to the first potential terminal through the first resistor and is connected to the second potential terminal.

In this embodiment of the present disclosure, the emitter of the first switch is connected to the first potential terminal, the base, i.e., the control terminal is connected to the first potential terminal through the first resistor. Therefore, when static electricity occurs, a voltage at the emitter is greater than a voltage at the control terminal, so that the first switch is conductive.

The collector of the second switch is connected to the first potential terminal through the first resistor. The emitter is connected to the second potential terminal. When the second switch is conductive, electrostatic charges may be discharged through the second switch.

In some embodiments, when the control terminal of the second switch is at a first level, the first discharge path is conductive.

If the second switch is an NPN semiconductor, the first level is a voltage value greater than the voltage at the emitter and less than the voltage at the collector. A PN junction corresponding to the collector, i.e., collector junction, is reverse biased, and the PN junction corresponding to the emitter, i.e., emitter junction is positive biased, so that the second switch is conductive, that is, is in an amplified state.

In this case, a large current generated from static electricity may be discharged through the second switch, thereby reducing damage by the static electricity to a device.

Figure 5:
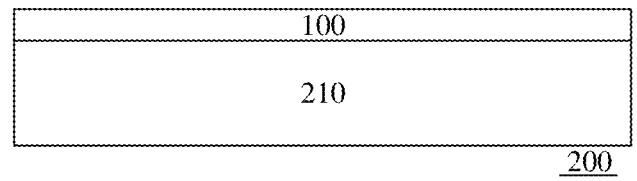
FIG. 5 is the schematic structural diagram of a semiconductor device according to the embodiments of the present disclosure.

Embodiments of the present disclosure further provide a semiconductor device. As shown in FIG. 5, a semiconductor device 200 includes the ESD protection circuit 100 in any one of the foregoing embodiments, and the ESD protection circuit is located on a surface of a substrate 210 of the semiconductor device 200.

In this embodiment of the present disclosure, the semiconductor device is a complex integrated circuit structure formed by using steps such as doping and etching on the substrate of a semiconductor material. Because there is a terminal for connection to an external circuit or a power supply in the semiconductor device, static electricity tends to cause circuit damage. Therefore, the foregoing ESD protection circuit may be disposed at a position of a terminal prone to static electricity in the semiconductor device.

In some embodiments, a first switch and a second switch of the ESD protection circuit are triodes formed between the substrate of the semiconductor device and a doped region on the surface of the substrate. A first resistor of the ESD protection circuit is a resistor of a semiconductor material in the semiconductor device.

At least one discharge path in the foregoing ESD protection circuit includes an SCR. The SCR is composed of the first switch and the second switch.

During the manufacturing of the semiconductor device, doping may be performed on a surface of a substrate of a semiconductor to form a doped region. A plurality of doped regions and the substrate may form a transistor structure, including a PNP transistor and an NPN transistor.

A plurality of resistors are further required in the ESD protection circuit. In this embodiment of the present disclosure, the semiconductor material itself has a resistance and therefore may be used as the first resistor in the ESD protection circuit, and an external resistor is not required.

In this way, the ESD protection circuit may occupy a very small space in the semiconductor device, and a manufacturing process is simple.

Embodiments of the present disclosure further provide an example as follows.

Figure 6:
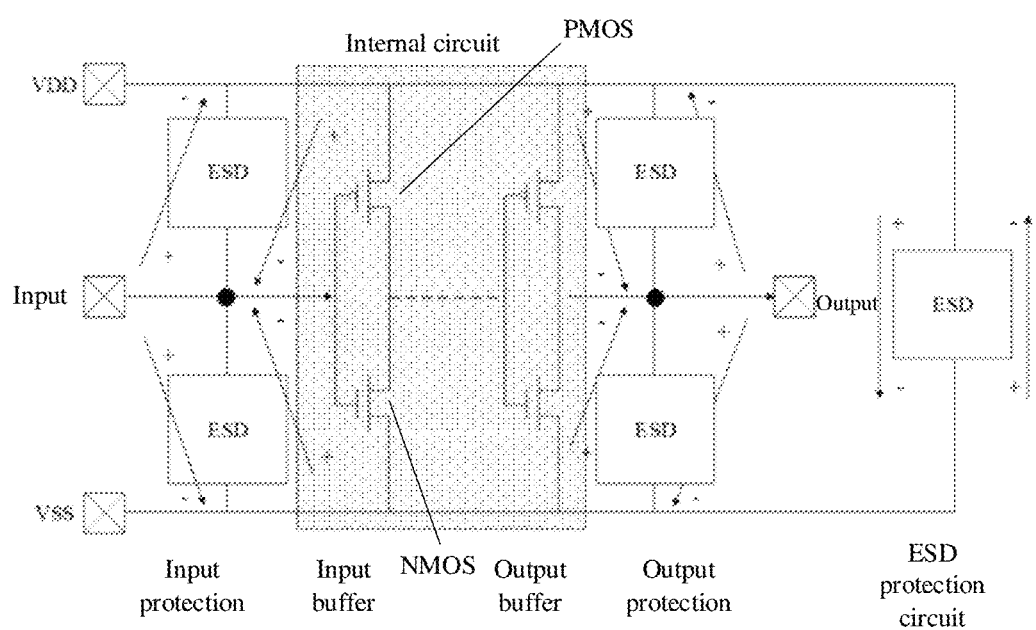
FIG. 6 is a schematic diagram of an application principle of an ESD protection circuit according to the embodiments of the present disclosure.
Figure 7:
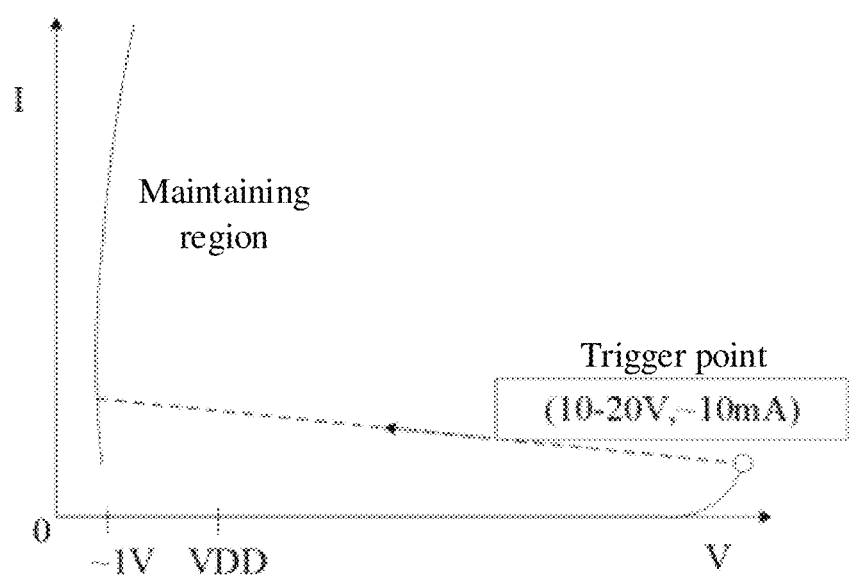
FIG. 7 is a schematic diagram of a current and voltage (IV) characteristic curve of an SCR ESD protection circuit according to the embodiments of the present disclosure.
Figure 8:
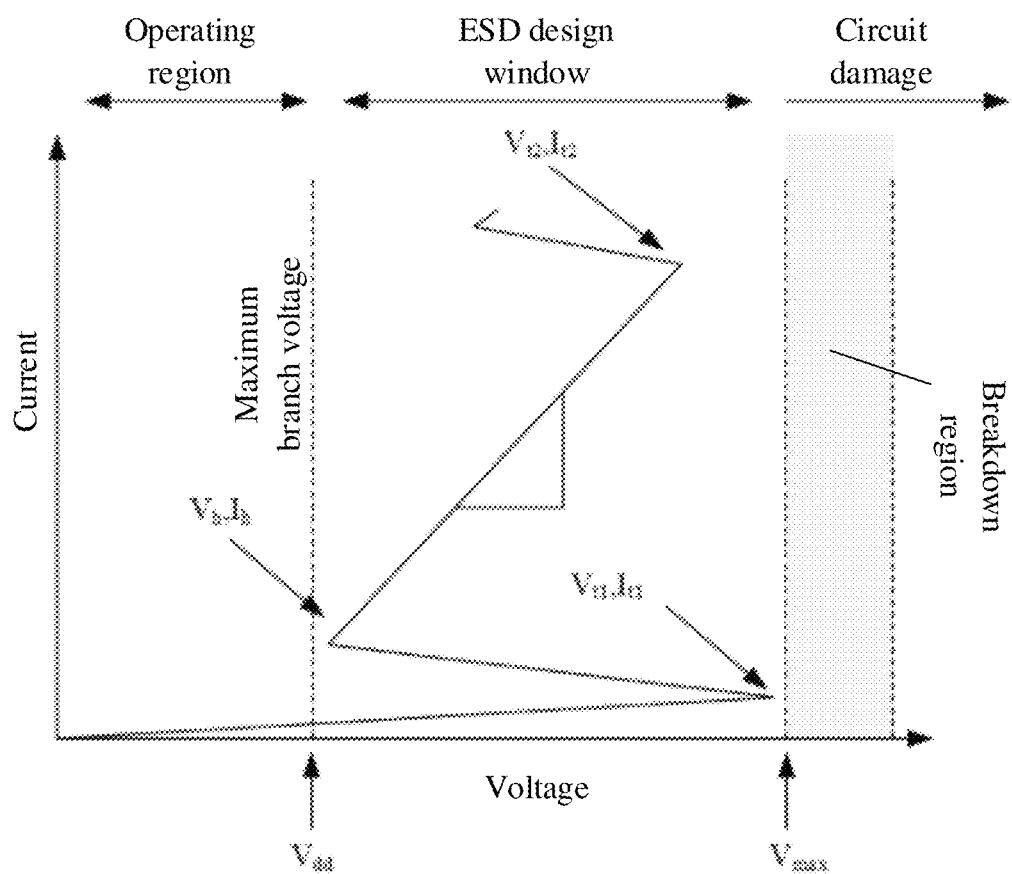
FIG. 8 is a schematic diagram of a design window for an ESD protection circuit according to the embodiments of the present disclosure.
Figure 9:
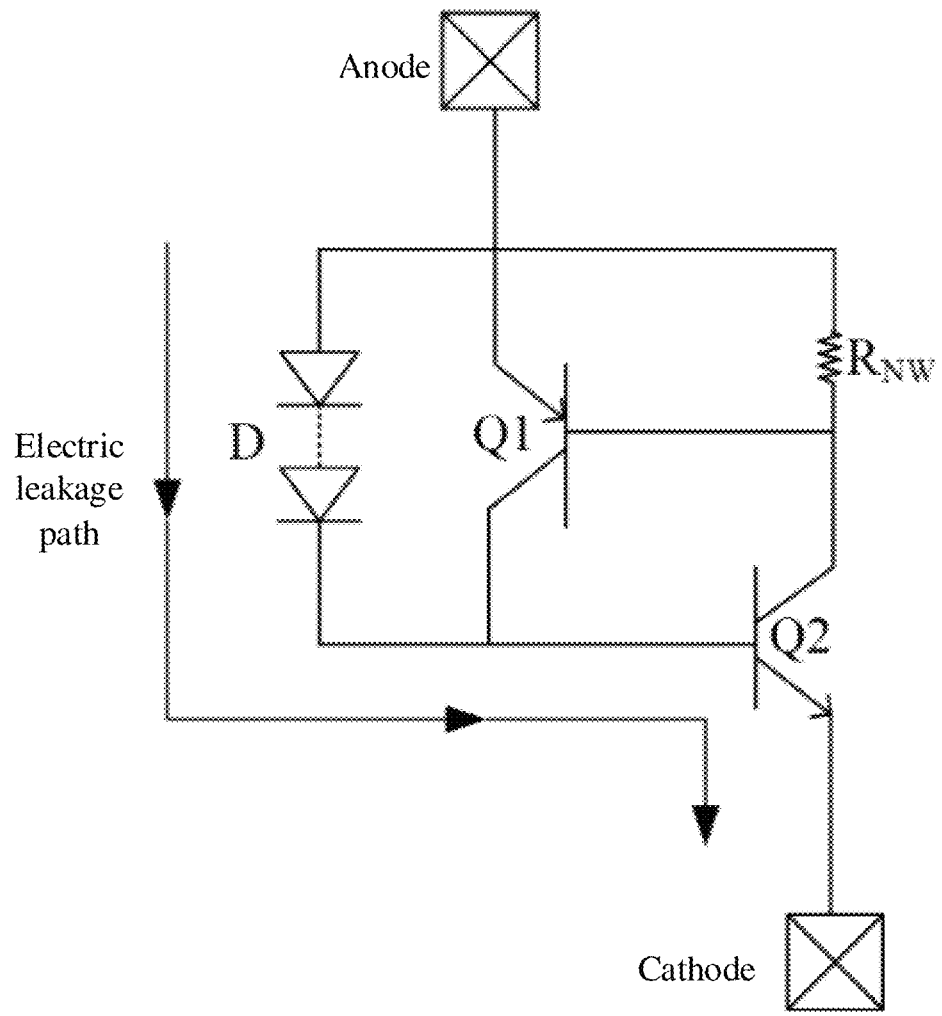
FIG. 9 is a schematic diagram of a Diode-triggered SCR (DTSCR) ESD protection circuit according to the embodiments of the present disclosure.

Modern semiconductor processes are becoming more and more advanced, a channel length becomes increasingly shorter, and a junction depth becomes increasingly shallower. In the applications of silicide and Laser Detector Diodes (LDDs), an oxide layer becomes increasingly thinner, an ESD design window becomes increasingly smaller, and the design of ESD protection is facing increasingly huge challenge. To protect an integrated circuit and reduce damage caused by static electricity, it is usually necessary to provide the integrated circuit with constant ESD protection. FIG. 6 is a schematic diagram of an ESD protection circuit. Used ESD devices may include a diode, a MOS, an SCR, and the like. However, for a conventional SCR, a trigger voltage is high, a maintaining voltage is low, and a latch-up tends to occur. Therefore, the SCR is not applicable to ESD protection for DRAM products. FIG. 7 shows an IV curve of an SCR. The IV curve has deviated from the ESD design window, as shown in FIG. 8. To apply an SCR to ESD protection for DRAM products, a DTSCR protection circuit shown in FIG. 9 is a preferred ESD protection circuit, Q1 and Q2 in the figure form an SCR, and $R_{NW}$ is a substrate resistor. However, electric leakage tends to occur.

The ESD protection circuit provided in the embodiments of the present disclosure has characteristics such as that a trigger voltage is low, electric leakage is low, a trigger voltage is adjustable, and a maintaining voltage is greater than VDD (a power supply voltage). Specifically, the ESD protection circuit provided in the embodiments of the present disclosure has the following technical effects.

First, a trigger voltage is low, electric leakage is low, and a trigger voltage may be adjusted according to an operating voltage of a DRAM product, so that requirements of the DRAM product are flexibly met.

Second, a maintaining voltage may be greater than an operating voltage, thereby reducing latch-ups.

Third, an ESD protection capability is high.

Fourth, an occupied area is small.

Fifth, an existing ESD design window may be used, so that the application range is wide.

Sixth, the normal use of an input circuit is not affected, thereby ensuring the normal operation of the circuit.

Figure 10:
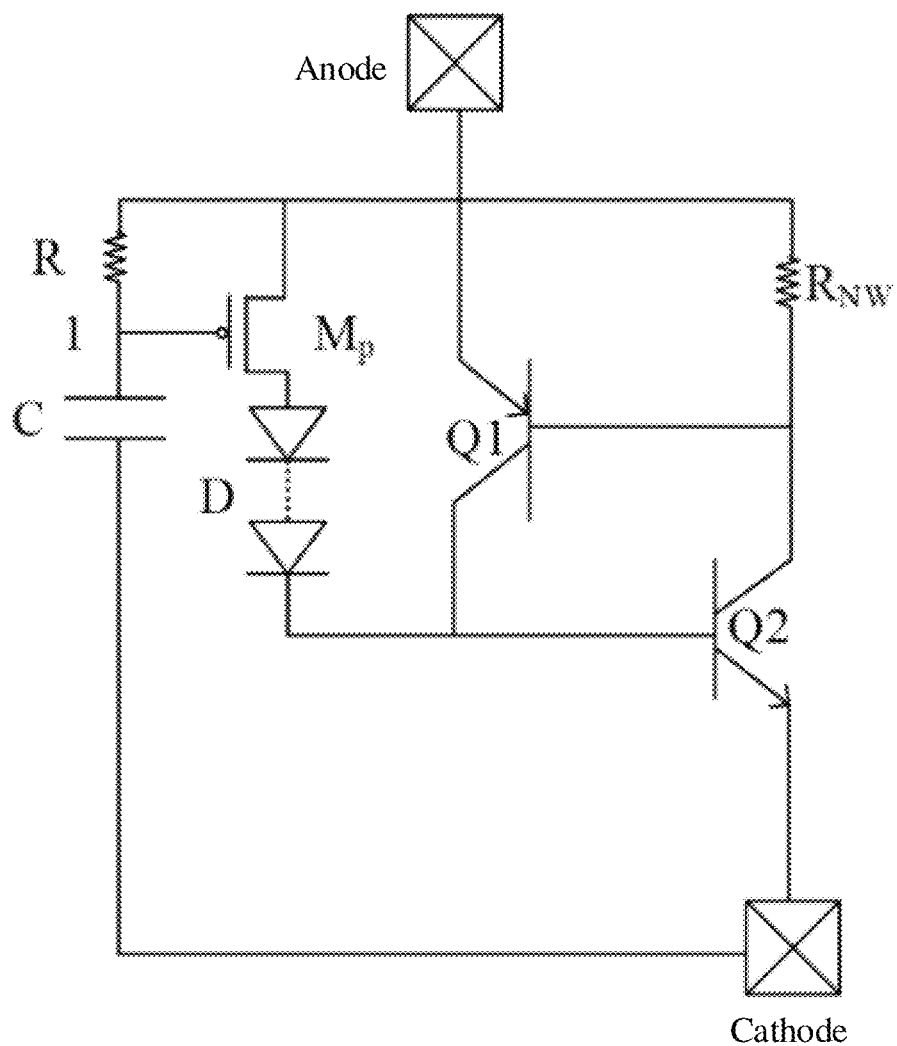
FIG. 10 is the fifth schematic structural diagram of an ESD protection circuit according to the embodiments of the present disclosure.

The ESD protection circuit provided in the embodiments of the present disclosure is shown in FIG. 10. When static electricity occurs, a point 1 is at a low level. A transistor Mp is conductive. A diode D connected in series is then conductive firstly, to trigger an SCR formed by Q1 and Q2 on the right to be conductive to discharge an electrostatic current. The amplitude of a trigger voltage of the SCR is determined by a quantity of diodes. Therefore, a quantity of diodes connected in series may be determined according to an ESD design window, thereby adjusting the trigger voltage.

During normal operation without electrostatic charges, the point 1 is connected to a high level at an anode of a first potential terminal through a resistor R, and the transistor Mp is in a blocked state. Therefore, the diode D connected in series is blocked, thereby reducing electric leakage that occurs in the diode D connected in series during normal operation.

By means of the ESD protection circuit provided in the technical solutions of the embodiments of the present disclosure, the first discharge path and a second discharge path connected in parallel may be used to discharge charges, and an SCR is used to implement the discharge of static electricity, so that electrostatic charges can be quickly discharged, to reduce damage caused by electric leakage to devices.

It should be understood that references throughout the specification to "one embodiment" or "an embodiment" mean that particular features, structures or characteristics associated with the embodiment are included in at least one embodiment of the present disclosure. Therefore, the words "in one embodiment" or "in an embodiment" appearing throughout the specification do not necessarily refer to the same embodiment. In addition, these particular features, structures, or characteristics may be combined in any appropriate manner in one or more embodiments. It should be understood that in the various embodiments of the present disclosure, the sequence numbers of the above processes do not imply the order of execution, and the order of execution of the processes shall be determined by their functions and intrinsic logic, and shall not constitute any limitation to the processes implemented in the embodiments of the present disclosure. The foregoing sequence numbers embodiments of the present disclosure are merely for the convenience of description, and do not imply the preference among the embodiments.

It should be noted that the terms "include", "comprise", or any variation thereof herein are intended to cover a non-exclusive inclusion. Therefore, in the context of a process, method, object or apparatus that includes a series of elements, the process, method, object or apparatus not only includes such elements, but also includes other elements not specified expressly, or may include inherent elements of the process, method, object or apparatus. If no more limitations are made, an element limited by "include a/an . . . " does not exclude other same elements existing in the process, the method, the object or the apparatus which includes the element.

In several embodiments provided in the present disclosure, it should be understood that the disclosed device and method may be implemented in other forms. The described device embodiment is merely an example. For example, the unit division is merely logical function division and may be other division in actual implementation. For example, a plurality of units or components may be combined or integrated into another system, or some features may be ignored or not performed. In addition, the shown or discussed mutual couplings or direct couplings or communication connections between the components may be implemented through some interfaces, indirect couplings or communication connections between the apparatuses or units, or electrical connections, mechanical connections, or connections in other forms.

The units described as separate parts may or may not be physically separate, and parts shown as units may or may not be physical units, that is, may be located in one position, or may be distributed on a plurality of network units. Some or all of the units may be selected according to actual needs to achieve the objects of the solutions in the embodiments.

In addition, functional units in the embodiments of the disclosure may all be integrated into one processing unit, or each of the units may exist alone, or two or more units are integrated into one unit. The integrated unit may be implemented in the form of hardware or a software functional unit in addition to hardware.

The foregoing descriptions are merely embodiments of the present disclosure. However, the embodiments of the present disclosure are not intended to limit the protection scope of the present disclosure. Any variation or replacement that may be readily figured out by a person skilled in the art within the technical scope disclosed in the disclosure shall fall within the protection scope of the embodiments of the present disclosure. Therefore, the scope of protection of the embodiments of the present disclosure shall be subject to the scope of protection of the claims.

By means of the ESD protection circuit provided in technical solutions of the embodiments of the present disclosure, a first discharge path and a second discharge path connected in parallel may be used to discharge charges, and an SCR is used to implement the discharge of static electricity, so that electrostatic charges can be quickly discharged, to reduce damage caused by electric leakage to devices.

What is claimed is:

1. An Electro-Static discharge (ESD) protection circuit, comprising:
   a first discharge path, located between a first potential terminal and a second potential terminal; and
   a second discharge path, located between the first potential terminal and the second potential terminal, and connected to the first discharge path in parallel, wherein the first discharge path and the second discharge path are used for discharging electrostatic charges,
   wherein at least one of the first discharge path and the second discharge path comprises a Silicon Controlled Rectifier (SCR),
   wherein the first discharge path comprises the SCR; and the second discharge path comprises at least one transistor and a Resistance-Capacitance (RC) control circuit, wherein the at least one transistor is conductive or blocked under control of the RC control circuit, and when the at least one transistor is conductive, the second discharge path is conductive.

2. The ESD protection circuit of claim 1, wherein the ESD protection circuit further comprises:
   an auxiliary subcircuit, separately connected to the first discharge path and the second discharge path, wherein the auxiliary subcircuit is configured to trigger the first discharge path and/or the second discharge path to be conductive.

3. The ESD protection circuit of claim 1, wherein the second discharge path at least comprises one PMOS, and the PMOS is connected in a position in the RC control circuit.

4. The ESD protection circuit of claim 3, wherein the second discharge path comprises two PMOSs, and the two PMOSs are connected in the position in the RC control circuit.

5. The ESD protection circuit of claim 4, wherein a source and a drain of a first PMOS of the two PMOSs are respectively connected between the first potential terminal and the second potential terminal.

6. The ESD protection circuit of claim 1, wherein the SCR comprises a first switch and a second switch;
   the first switch is connected between the first potential terminal and a control terminal of the second switch;
   a control terminal of the first switch is connected to the first potential terminal; and
   the second switch is connected between the first potential terminal and the second potential terminal.

7. The ESD protection circuit of claim 6, wherein the first switch is a PNP triode, and the second switch is an NPN triode.

8. The ESD protection circuit of claim 6, wherein the SCR further comprises a first resistor;
   the control terminal of the first switch is connected to the first potential terminal through the first resistor; and
   the second switch is connected to the first potential terminal through the first resistor, and is connected to the second potential terminal.

9. The ESD protection circuit of claim 6, wherein when the control terminal of the second switch is at a first level, the first discharge path is conductive.

10. An Electro-Static discharge (ESD) protection circuit, comprising:
    a first discharge path, located between a first potential terminal and a second potential terminal; and
    a second discharge path, located between the first potential terminal and the second potential terminal, and connected to the first discharge path in parallel, wherein the first discharge path and the second discharge path are configured to discharge electrostatic charges,
    wherein at least one of the first discharge path and the second discharge path comprises a Silicon Controlled Rectifier (SCR),
    wherein the ESD protection circuit further comprises:
    an auxiliary subcircuit, separately connected to the first discharge path and the second discharge path, wherein the auxiliary subcircuit is configured to trigger the first discharge path and/or the second discharge path to be conductive,
    wherein the first discharge path comprises the SCR; and the auxiliary subcircuit comprises:
    a Positive-Channel Metal-Oxide-Semiconductor Transistor (PMOS) and at least one diode, wherein the at least one diode is connected to the PMOS in series, is connected to a control terminal of the SCR, and is used for triggering the first discharge path to be conductive.

11. The ESD protection circuit of claim 10, wherein the at least one diode comprises at least two diodes, and the at least two diodes are connected in series and are connected to the PMOS in series.

12. The ESD protection circuit of claim 10, wherein the PMOS is a common component of the auxiliary subcircuit and the second discharge path.

13. A semiconductor device, comprising an Electro-static discharge (ESD) protection circuit, wherein the ESD protection circuit is located on a surface of a substrate of the semiconductor device, and the ESD protection circuit comprises:
    a first discharge path, located between a first potential terminal and a second potential terminal; and
    a second discharge path, located between the first potential terminal and the second potential terminal, and connected to the first discharge path in parallel, wherein the first discharge path and the second discharge path are used for discharging electrostatic charges,
    wherein at least one of the first discharge path and the second discharge path comprises a Silicon Controlled Rectifier (SCR),
    wherein the first discharge path comprises the SCR; and the second discharge path comprises at least one transistor and a Resistance-Capacitance (RC) control circuit, wherein the at least one transistor is conductive or blocked under control of the RC control circuit, and when the at least one transistor is conductive, the second discharge path is conductive.

14. The semiconductor device of claim 13, wherein a first switch and a second switch of the ESD protection circuit are triodes formed between the substrate and a doped region on the surface of the substrate of the semiconductor device; and a first resistor of the ESD protection circuit is a resistor of a semiconductor material in the semiconductor device.

15. The semiconductor device of claim 14, wherein the auxiliary subcircuit comprises:
    a Positive-Channel Metal-Oxide-Semiconductor Transistor (PMOS) and at least one diode, wherein the at least one diode is connected to the PMOS in series, is connected to a control terminal of the SCR, and is used for triggering the first discharge path to be conductive.

16. The semiconductor device of claim 15, wherein the at least one diode comprises at least two diodes, and the at least two diodes are connected in series and are connected to the PMOS in series.

17. The semiconductor device of claim 15, wherein the PMOS is a common component of the auxiliary subcircuit and the second discharge path.

18. The semiconductor device of claim 13, wherein the ESD protection circuit further comprises:
- an auxiliary subcircuit, separately connected to the first discharge path and the second discharge path, wherein the auxiliary subcircuit is configured to trigger the first discharge path and/or the second discharge path to be conductive.

* * * * *